US012677543B2

(12) United States Patent
Kim et al.

(10) Patent No.: US 12,677,543 B2
(45) Date of Patent: Jul. 7, 2026

(54) DISPLAY DEVICE NANO PARTICLE BARRIER LAYER

(71) Applicant: LG Display Co., Ltd., Seoul (KR)

(72) Inventors: Hyejin Kim, Paju-si (KR); Huiseong Yu, Jeonju-si (KR); SungHo Lee, Daegu (KR); Wooseok Noh, Seoul (KR); Youngjune Go, Uijeongbu-si (KR)

(73) Assignee: LG DISPLAY CO., LTD., Seoul (KR)

( * ) Notice: Subject to any disclaimer, the term of this patent is extended or adjusted under 35 U.S.C. 154(b) by 565 days.

(21) Appl. No.: 18/087,571

(22) Filed: Dec. 22, 2022

(65) Prior Publication Data

US 2023/0209915 A1 Jun. 29, 2023

(30) Foreign Application Priority Data

Dec. 23, 2021 (KR) ........................ 10-2021-0185826

(51) Int. Cl.

*H10K 59/123* (2023.01)
*H10K 59/80* (2023.01)
*H10K 102/10* (2023.01)

(52) U.S. Cl.

CPC ..... *H10K 59/123* (2023.02); *H10K 59/80524* (2023.02); *H10K 59/873* (2023.02); *H10K 2102/102* (2023.02)

(58) Field of Classification Search

CPC ............... H10K 59/123; H10K 59/873; H10K 59/80524; H10K 2102/102
USPC ............................................. 257/40, 59, 99
See application file for complete search history.

(56) References Cited

U.S. PATENT DOCUMENTS

| | | | | |
|---|---|---|---|---|
| 2009/0253851 | A1* | 10/2009 | Ohara | C08K 3/36 423/337 |
| 2016/0088756 | A1 | 3/2016 | Ramadas | |
| 2018/0145280 | A1* | 5/2018 | Furuie | H10K 59/124 |
| 2018/0226610 | A1 | 8/2018 | Moon et al. | |
| 2019/0157618 | A1 | 5/2019 | Park et al. | |
| 2019/0163009 | A1* | 5/2019 | Lee | G02F 1/133512 |
| 2019/0326333 | A1 | 10/2019 | Cho | |

(Continued)

FOREIGN PATENT DOCUMENTS

| | | | |
|---|---|---|---|
| CN | 106653688 | A | 5/2017 |
| CN | 106816548 | A | 6/2017 |

(Continued)

*Primary Examiner* — Eric W Jones

(74) *Attorney, Agent, or Firm* — Birch, Stewart, Kolasch & Birch, LLP

(57) ABSTRACT

A display device can include a substrate in which a display area and a non-display area are disposed, a thin film transistor disposed on a the substrate that corresponds to the display area, a gate driver disposed on a portion of the substrate that corresponds to the non-display area, a protection layer disposed to cover the thin film transistor and the gate driver, a planarization layer disposed on the protection layer and including a plurality of openings exposing at least a part of the protection layer in the non-display area, an organic light emitting diode disposed on the planarization layer so as to be electrically connected to the thin film transistor in the display area, and a nano particle layer disposed on the protection layer overlapping the plurality of openings. The nano particle layer includes nano particles surface-modified with a hydrophobic functional group.

10 Claims, 4 Drawing Sheets

(56) References Cited

U.S. PATENT DOCUMENTS

| | | | | |
|---|---|---|---|---|
| 2021/0066418 | A1 | 3/2021 | Seo et al. | |
| 2021/0408444 | A1* | 12/2021 | Ouyang ............. | H10K 59/1201 |

FOREIGN PATENT DOCUMENTS

| | | | |
|---|---|---|---|
| CN | 107438588 | A | 12/2017 |
| CN | 109860226 | A | 6/2019 |
| CN | 112447930 | A | 3/2021 |
| CN | 112928141 | A | 6/2021 |
| KR | 10-2016-0012146 | A | 2/2016 |
| KR | 10-2016-0064373 | A | 6/2016 |
| KR | 10-2018-0060311 | A | 6/2018 |
| KR | 10-2018-0078820 | A | 7/2018 |
| KR | 10-2018-0093161 | A | 8/2018 |
| KR | 10-2019-0007983 | A | 1/2019 |
| KR | 10-2019-0026351 | A | 3/2019 |
| KR | 10-2019-0059051 | A | 5/2019 |
| KR | 10-2019-0063753 | A | 6/2019 |
| KR | 10-2019-0081724 | A | 7/2019 |
| KR | 10-2020-0025920 | A | 3/2020 |
| KR | 10-2021-0028789 | A | 3/2021 |
| KR | 10-2021-0055422 | A | 5/2021 |
| KR | 10-2021-0130329 | A | 11/2021 |

* cited by examiner

DISPLAY DEVICE NANO PARTICLE BARRIER LAYER

CROSS-REFERENCE TO RELATED APPLICATIONS

This application claims priority to Korean Patent Application No. 10-2021-0185826 filed on Dec. 23, 2021 in the Republic of Korea, the entire contents of which are hereby expressly incorporated by reference into the present application.

BACKGROUND

Field

The present disclosure relates to a display device, and more particularly, to a display device which suppresses conductivization of a gate driver and suppresses the moisture permeation to improve a reliability of the display device.

Discussion of the Related Art

An organic light emitting display device is a self-emitting display device so that a separate light source is not necessary, which is different from a liquid crystal display device. Therefore, the organic light emitting display device can be manufactured to have light weight and small thickness.

Further, since the organic light emitting display device is driven at a low voltage, it is advantageous not only in terms of power consumption, but also in terms of the response speed, viewing angle, and contrast ratio (CR). As a result, the light emitting display device is being studied as one of the next generation displays.

In response to the market demand for a lighter and thinner organic light emitting display device, attempts have been made to make the bezel area as thin as possible so that a gate drive-IC in panel (GIP manner) in which the gate driver is mounted in the display panel is being applied.

The gate driver configured by the GIP manner can include a thin film transistor which uses an oxide semiconductor as an active layer. The thin film transistor using an oxide semiconductor has advantages of excellent mobility, a low leakage current, and uniform distribution of threshold voltages, as compared with a silicon-based thin film transistor.

SUMMARY OF THE DISCLOSURE

According to the related art, in order to suppress oxidation or deterioration of the gate driver due to moisture permeating into a side surface of an organic light emitting display device, a layer formed of an organic material which can be vulnerable to the moisture permeation is patterned in a non-display area to form an opening. In this case, the organic material layer is not formed as a continuous layer, but is disconnected by the openings to block a moisture permeation path. Accordingly, the reliability of the display device can be improved.

However, when an encapsulation layer is formed, hydrogen generated during the deposition process can be easily diffused into the gate driver by the opening. If the gate driver includes a thin film transistor formed of an oxide semiconductor, the oxide semiconductor can be reduced by the hydrogen to be conducted and the driving characteristic of the gate driver can be degraded.

Accordingly, an object to be achieved by the present disclosure is to provide a display device which suppresses the conductivization of the gate driver by suppressing the degradation of the reliability due to the moisture permeation and by suppressing the diffusion of hydrogen generated during the deposition process.

Another object of the present disclosure is to provide a display device which addresses the limitations associated with the related art.

Objects of the present disclosure are not limited to the above-mentioned objects, and other objects, which are not mentioned above, can be clearly understood by those skilled in the art from the following descriptions.

According to an aspect of the present disclosure, a display device includes a substrate in which a display area and a non-display area are defined; a thin film transistor disposed on the substrate corresponding to the display area; a gate driver disposed on the substrate corresponding to the non-display area; a protection layer disposed so as to cover the thin film transistor and the gate driver; a planarization layer which is disposed on the protection layer and includes a plurality of openings which exposes at least a part of the protection layer in the non-display area; an organic light emitting diode which is disposed on the planarization layer so as to be electrically connected to the thin film transistor in the display area; and a nano particle layer disposed on the protection layer overlapping the plurality of openings, in which the nano particle layer includes nano particles surface-modified with a hydrophobic functional group.

Other detailed matters of the exemplary embodiments are included in the detailed description and the drawings.

According to the present disclosure, the moisture permeation is suppressed by a nano particle layer disposed in the openings of the planarization layer and the moisture permeation path is increased to suppress the deterioration of the display device due to the moisture. Accordingly, a display device having a high reliability can be provided.

Further, according to the present disclosure, hydrogen generated during the deposition process is suppressed from being diffused to the gate driver by the nano particle layer formed so as to correspond to the gate driver and the conductivization of the gate driver due to the hydrogen can be suppressed. Accordingly, a display device having an excellent driving characteristic can be provided.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
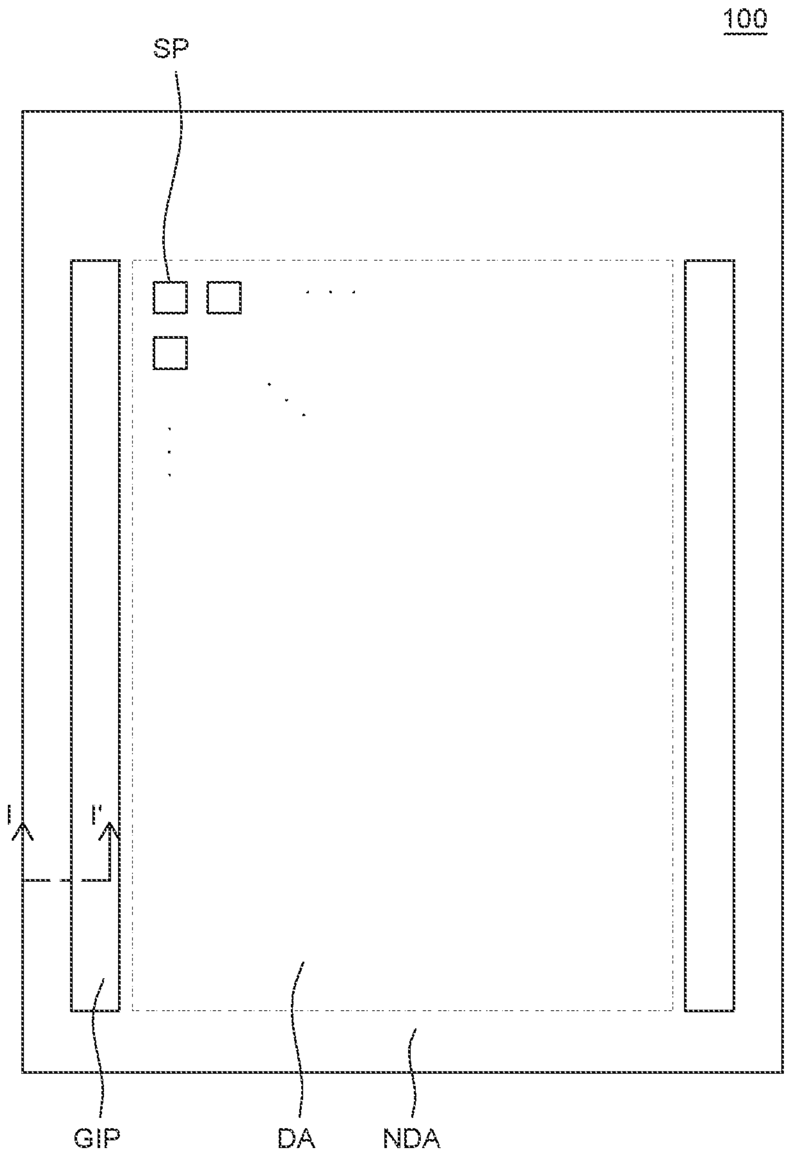
FIG. 1 is a plan view of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define any order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to the embodiments of the present disclosure will be described in detail with reference to accompanying drawings. All the components of each display device according to all embodiments of the present disclosure are operatively coupled and configured.

Figure 2:
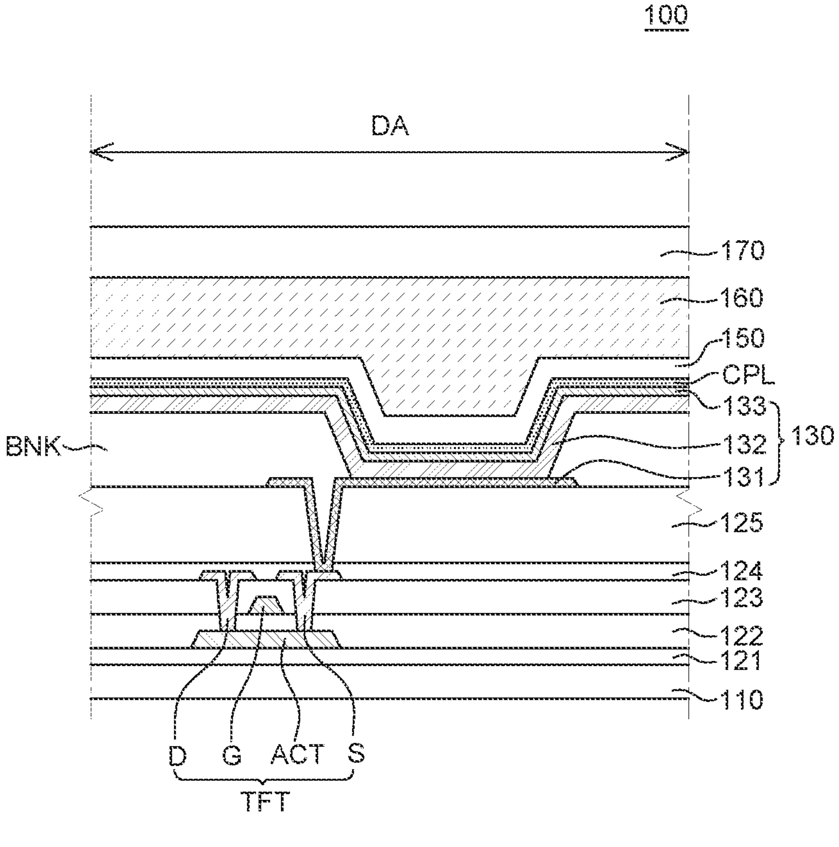
FIG. 2 is a cross-sectional view of one sub pixel of a display device according to an embodiment of the present disclosure.
Figure 3:
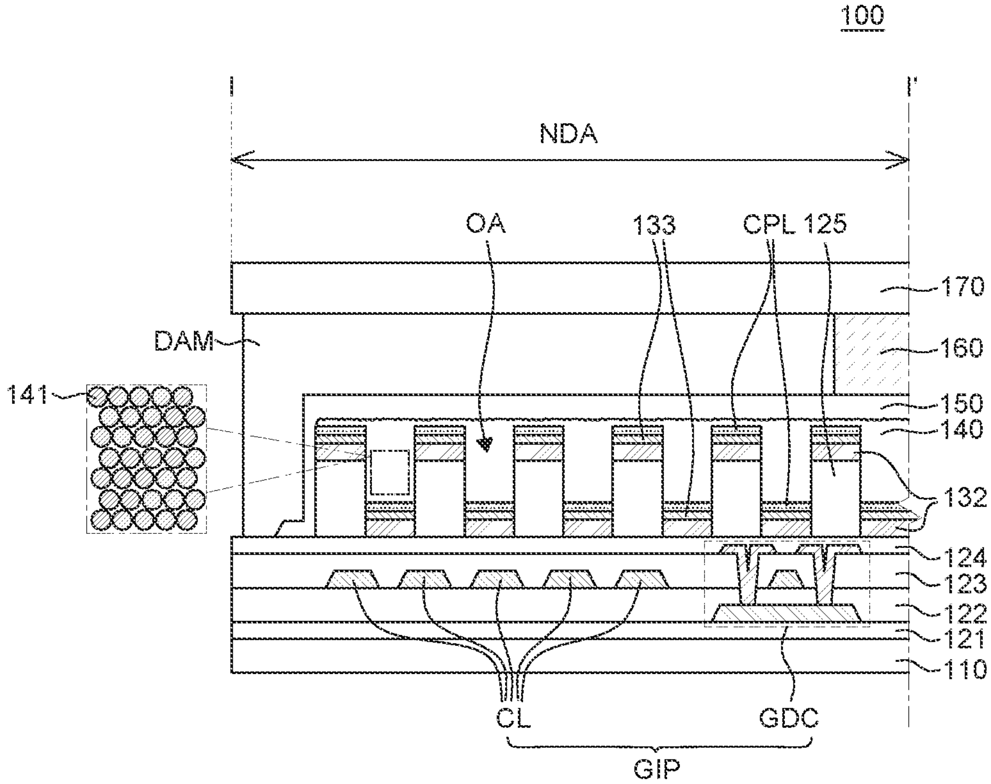
FIG. 3 is a cross-sectional view taken along the line I-I' of FIG. 1.

FIG. 1 is a plan view of a display device according to an embodiment of the present disclosure, FIG. 2 is a cross-sectional view of one sub pixel of a display device according to an embodiment of the present disclosure, and FIG. 3 is a cross-sectional view taken along the line I-I' of FIG. 1.

Referring to FIGS. 1 to 3, a display device 100 according to the embodiment of the present disclosure includes a substrate 110, a thin film transistor TFT, a gate driver GIP, a protection layer 124, a planarization layer 125, an organic light emitting diode 130, a nano particle layer 140, an encapsulation layer 150, an adhesive layer 160, a dam DAM, and an encapsulation substrate 170.

The substrate 110 includes areas defined as a display area DA and a non-display area NDA. The display area DA is an area where a plurality of pixels is disposed to display images. In the display area DA, pixels including a light emitting unit for displaying images and a driving circuit for driving the pixels can be disposed. Each pixel includes a plurality of sub pixels SP. The sub pixel SP is an element for displaying one color. The non-display area NDA encloses the display area DA. The non-display area NDA is an area where images are not displayed and various wiring lines, driving circuits, and printed circuit boards for driving the pixels and the driving elements disposed in the display area DA are disposed therein. For example, in the non-display area NDA, various driving circuits, such as a gate driver circuit or a data driving circuit, and signal lines are disposed.

The substrate 110 is a base material which supports various elements for driving the display device 100. The substrate 110 is formed of a material having an excellent insulating property and anti-moisture permeability. For example, the substrate 110 can be a glass substrate or a plastic substrate, but is not limited thereto. For example, the plastic substrate can be formed of a material selected from polyethylene phthalate, polyimide, polyamide, and polycarbonate, but is not limited thereto.

A buffer layer 121 is disposed on the substrate 110. The buffer layer 121 enhances the adhesiveness between an active layer ACT or various conductive material layers disposed on the substrate 110 and the substrate 110. Further, the buffer layer 121 can block foreign materials above the substrate 110 from the outside and moisture entering from the outside. The buffer layer 121 can be formed as a single layer and can be formed as multiple layers as needed. For example, the buffer layer 121 can be formed of an inorganic material such as silicon oxide, silicon nitride, or silicon oxynitride, but is not limited thereto.

The thin film transistor TFT is disposed on the buffer layer 121. In the drawing, among various thin film transistors which can be included in the display device 100, only a driving thin film transistor is illustrated for the sake of convenience, but a switching thin film transistor and a capacitor can also be included.

The thin film transistor TFT is an element for driving the organic light emitting diode 130 disposed in the display area DA. The thin film transistor TFT includes a gate electrode G, an active layer ACT, a source electrode S, and a drain electrode D. The active layer ACT is disposed on the buffer layer 121. The active layer ACT can be formed of a metal oxide semiconductor. A gate insulating layer 122 can be disposed on the active layer ACT. For example, the gate insulating layer 122 can be formed of an inorganic material such as silicon oxide, silicon nitride, or silicon oxynitride, but is not limited thereto. Further, the gate insulating layer 122 can be configured as a single layer or multiple layers. The gate electrode G is disposed on the gate insulating layer 122. An interlayer insulating layer 123 is disposed on the gate electrode G to cover the gate electrode. For example, the interlayer insulating layer 123 can be formed of an inorganic material such as silicon oxide, silicon nitride, or silicon oxynitride, but is not limited thereto. Further, the interlayer insulating layer 123 can be configured as a single layer or multiple layers. Each of the source electrode S and the drain electrode D is disposed on the interlayer insulating layer 123 and is connected to the active layer ACT by means of a contact hole which passes through the gate insulating layer 122 and the interlayer insulating layer 123. The structure of the thin film transistor TFT is not limited thereto and can vary if necessary.

In the non-display area NDA, a plurality of signal lines CL is disposed on the gate insulating layer 122. The plurality of signal lines CL can be disposed on the gate insulating layer 122 as the same as the gate electrode G of the thin film transistor TFT. The plurality of signal lines CL can be formed of the same electrode material in the same process as the gate electrode G. For example, each of the plurality of signal lines CL can be a clock signal line, a start signal line, or the like.

The gate driver GIP is disposed in the non-display area NDA. The gate driver GIP includes a gate driver circuit GDC and a plurality of signal lines CL.

The gate driver circuit GDC is disposed on the buffer layer 121. The gate driver circuit GDC is disposed on the buffer layer 121 between the plurality of signal lines CL and the thin film transistor TFT. The gate driver circuit GDC is connected to a gate line which is connected to each of the plurality of pixels disposed in the display area DA. The gate driver circuit GDC is disposed on the same surface as the thin film transistor TFT and formed of the same material in the same process as the thin film transistor TFT.

The protection layer 124 is disposed so as to directly cover the thin film transistor TFT, the gate driver circuit GDC, and the plurality of signal lines CL. The protection layer 124 is disposed on the entire surface of the display area DA and the non-display area NDA so as to cover the thin film transistor TFT, the gate driver circuit GDC, and the plurality of signal lines CL. The protection layer 124 can include a contact hole to electrically connect the source electrode S or the drain electrode D of the thin film transistor TFT to the organic light emitting diode 130. For example, the protection layer 124 can be formed of an inorganic material such as silicon oxide, silicon nitride, or silicon oxynitride, but is not limited thereto.

It is illustrated that the gate insulating layer 122, the interlayer insulating layer 123, and the protection layer 124 provide flat surfaces, respectively, but are not limited thereto. Depending on the process method or the design, each of the gate insulating layer 122, the interlayer insulating layer 123, and the protection layer 124 can be formed as a conformal thin film to have a constant thickness regardless of the shape of the lower layers. In this case, upper surfaces of the gate insulating layer 122, the interlayer insulating layer 123, and the protection layer 124 can not be flat.

The planarization layer 125 can be disposed on the protection layer 124. The planarization layer 125 is disposed on the entire surface of the display area DA and the non-display area NDA so as to cover the thin film transistor TFT, the gate driver circuit GDC, and the plurality of signal lines CL. The planarization layer 125 planarizes upper surfaces of the thin film transistor TFT, the gate driver circuit GDC, and the plurality of signal lines CL. The planarization layer 125 can be formed of an organic material to easily provide a flattened surface. For example, the planarization layer 125 can be formed of a material selected from polyimide, benzocyclobutyne resin, and acrylate resin, but is not limited thereto. The planarization layer 125 can include a contact hole to electrically connect the source electrode S or the drain electrode D of the thin film transistor TFT to the organic light emitting diode 130.

The planarization layer 125 includes a plurality of openings OA to expose at least a part of the protection layer 124 in the non-display area NDA. Specifically, the planarization layer 125 can include a plurality of openings OA in an area of the non-display area NDA overlapping the gate driver GIP. For example, the planarization layer 125 can be patterned to have a plurality of openings OA in an area overlapping the gate driver GIP. As described above, when the planarization layer 125 is patterned to have a plurality of openings OA in the non-display area NDA, the visible recognition of the gate driver GIP to the user is minimized so that it is advantageous to implement a transparent display device. Further, the planarization layer 125 is formed of an organic material so that an anti-moisture permeability is inferior to that of the insulating layers formed of an inorganic material. However, when the planarization layer 125 is patterned, a path through which moisture entering from the outside proceeds to the display area DA is blocked by the plurality of openings OA. Therefore, the degradation of the reliability due to the moisture permeation can be suppressed.

The organic light emitting diode 130 is disposed on the planarization layer 125 in the display area DA. The organic light emitting diode 130 can be disposed so as to correspond to each of the plurality of sub pixels SP. The organic light emitting diode 130 includes an anode 131, an organic light emitting layer 132, and a cathode 133.

The anode 131 is disposed on the planarization layer 125. The anode 131 is formed to be separated for each of the plurality of sub pixels SP. The anode 131 is disposed on the planarization layer 125 so as to correspond to the emission area of each sub pixel SP. The anode 131 can be electrically connected to the source electrode S or the drain electrode D of the thin film transistor TFT by means of the contact hole.

The anode 131 can be configured by a metallic material having a high work function. The anode 131 is formed of a reflective material to have a reflection property and if necessary, a reflection layer can be disposed below the anode 131.

A bank BNK can be disposed on planarization layer 125 and the anode 131. The bank BNK defines an emission area of the organic light emitting layer 132. Specifically, the bank BNK can be disposed on the planarization layer 125 so as to expose at least a part of the anode 131. The bank BNK can be disposed on the planarization layer 125 so as to cover an edge of the anode 131.

The organic light emitting layer 132 is disposed on the anode 131. The organic light emitting layer 132 includes a light emitting material to emit light. Unlike the anode 131, the organic light emitting layer 132 is not separated for every sub pixel SP, but can be formed as one layer. In the display area DA, the organic light emitting layer 132 is disposed so as to cover the anode 131 and the bank BNK. In the non-display area NDA, the organic light emitting layer 132 is disposed above the planarization layer 125 and on the protection layer 124 exposed by the plurality of openings OA. In the non-display area NDA, the organic light emitting layer 132 is not formed as one layer, but can be formed to be cut by the openings OA provided in the planarization layer 125. However, a structure of the organic light emitting layer 132 is not limited thereto. If necessary, the organic light emitting layer 132 can be formed to be separated for every sub pixel SP, like the anode 131 and specifically, disposed on the anode 131 which is exposed without being covered by the bank BNK. In this case, the organic light emitting layer 132 is not formed in the non-display area NDA, but can be omitted.

The cathode 133 is disposed on the organic light emitting layer 132. The cathode 133 can be formed as one layer without being separated for every sub pixel SP. The cathode 133 is disposed to cover the organic light emitting layer 132 in the display area DA and the non-display area NDA. In the non-display area NDA, the cathode 133 is not formed as one layer, but can be formed to be cut, by the openings OA provided in the planarization layer 125, like the organic light emitting layer 132. However, it is not limited thereto so that in accordance with a deposition thickness of the cathode 133 or for a process reason, in the non-display area NDA, the cathode 133 can be formed as one layer without being cut.

The cathode 133 can be formed of a metallic material having a low work function or a transparent conductive oxide. When the cathode 133 is formed of a metallic material, the cathode 133 is formed with a very thin thickness to be substantially transparent.

A capping layer CPL is disposed on the cathode 133. The capping layer CPL is formed to improve an optical characteristic of the organic light emitting diode 130. Further, the capping layer CPL protects the cathode 133 so as not to be oxidized or deteriorated. For example, the capping layer CPL can be formed of an organic material or metal oxide including LiF. Further, the capping layer CPL is formed with a thickness of 100 Å to 5000 Å so as not to degrade light transmittance. As described above, when the capping layer CPL is formed, the luminous efficiency and the viewing angle of the organic light emitting diode 130 are improved so that the display quality is excellent.

In the non-display area NDA, the capping layer CPL is not formed as one layer, but can be formed to be cut, by the plurality of openings OA provided in the planarization layer 125, like the cathode 133. However, it is not limited thereto so that in accordance with a deposition thickness or for a process reason, in the non-display area NDA, the capping layer CPL can be formed as one layer without being cut.

In the non-display area NDA, the organic light emitting layer 132, the cathode 133, and the capping layer CPL are sequentially laminated above the planarization layer 125 and on the protection layer 124 exposed by the plurality of openings OA. As described above, similar to the display area DA, when the planarization layer 125, the organic light emitting layer 132, the cathode 133, and the capping layer CPL are laminated also in the non-display area NDA, the transmittance difference between the display area DA and the non-display area NDA can be reduced. The visible recognition of the gate driver GIP which includes a plurality of wiring lines formed of a metal material in the non-display area NDA can be reduced. Accordingly, the optical characteristic between the display area DA and the non-display area NDA is controlled to be similar so that a transparent display device can be easily implemented.

The nano particle layer 140 is disposed in the non-display area NDA. The nano particle layer can be disposed so as to overlap the gate driver GIP in the non-display area NDA. Specifically, the nano particle layer 140 can be disposed so as to overlap the planarization layer 125 of the non-display area NDA and the plurality of openings OA provided in the planarization layer 125. Therefore, the nano particle layer 140 covers an upper surface of the planarization layer 125 in the non-display area NDA and is filled in the plurality of openings OA. For example, in the non-display area NDA, the organic light emitting layer 132, the cathode 133, the capping layer CPL, and the nano particle layer 140 are sequentially laminated above the planarization layer 125 and on the protection layer 124 exposed by the plurality of openings OA, but is not limited thereto. If necessary, in the non-display area NDA, the organic light emitting layer 132, the cathode 133, or the capping layer CPL can be omitted. When all of them are omitted, the nano particle layer 140 can be directly disposed on the protection layer 124 exposed by the plurality of openings OA.

The nano particle layer 140 includes nano particles 141 surface-modified with a hydrophobic functional group. The nano particle layer 140 is a layer formed by interaction between hydrophobic functional groups of nano particles 141 surface-modified with a hydrophobic functional group. The nano particles 141 surface-modified with a hydrophobic functional group have properties opposite to those of hydrophilic moisture to suppress the permeation of the moisture. Further, the nano particle layer 140 has complex surface morphology inside and outside thereof by interaction between the nano particles 141 surface-modified with a hydrophobic functional group. Accordingly, even though the moisture permeates, the moisture permeation path is increased to contribute to improvement of the reliability of the display device 100.

Further, the nano particle layer 140 can protect the gate driver GIP. Specifically, when the gate driver GIP includes a layer formed by oxide semiconductor, the nano particle layer 140 can protect the gate driver GIP so as not to be conducted. For example, the gate driver circuit GDC can include an active layer formed of the oxide semiconductor. In the oxide semiconductor, a carrier concentration is increased in a predetermined carrier concentration range so that the mobility is increased. However, when the carrier concentration exceeds a predetermined concentration, the oxide semiconductor is conducted to lose the property of the semiconductor so that the performance of the gate driver circuit GDC is degraded. The carrier concentration of the oxide semiconductor can be increased by various external factors such as a process of manufacturing or using the display device 100. For example, when the oxide semiconductor is reduced by the hydrogen or the like, the carrier concentration is increased.

The encapsulation layer 150 to be described below is formed on the entire surface of the display area DA and the non-display area NDA by the deposition process. Hydrogen is generated during the process of depositing the encapsulation layer 150 and is diffused to the gate driver GIP to conduct the oxide semiconductor. In the display device 100 according to the exemplary embodiment of the present disclosure, the nano particle layer 140 is disposed so as to overlap the gate driver GIP to suppress the diffusion of the hydrogen into the gate driver GIP during the deposition process for forming the encapsulation layer 150. Therefore, the reduction of the oxide semiconductor due to the hydrogen is suppressed to protect the gate driver GIP so as not to be conducted.

For example, the nanoparticles can be one or more selected from silica ($SiO_2$) nanoparticles, titanium dioxide ($TiO_2$) nanoparticles, tin oxide ($SnO_2$) nanoparticles, zinc oxide (ZnO) nanoparticles, copper oxide (CuO) nanoparticles, zirconium oxide ($ZrO_2$) nanoparticles, tungsten oxide ($WO_2$) nanoparticles, tantalum pentoxide ($Ta_2O_5$) nanoparticles, vanadium pentoxide ($V_2O_5$) nanoparticles, and iron oxide ($Fe_2O_3$) nanoparticles. Since the nanoparticles 141 are easily surface-modified with hydrophobic functional groups, when the nanoparticle layer 140 is formed by including the nanoparticles, the moisture permeation path is increased to minimize deterioration of the display device due to moisture permeation, and provide a display device with high reliability.

For example, the hydrophobic functional group can be a trialkyl silane group represented by Formula 1 below. The trialkyl silane group has a hydrophobicity to suppress the permeation of the moisture from the outside and suppress the moisture from proceeding toward the display area DA. Further, the trialkyl silane group can suppress the diffusion of the hydrogen generated during the deposition process of forming the encapsulation layer 150 into the gate driver GIP. Accordingly, anti-moisture permeation reliability of the display device is improved and the performance of the gate driver GIP can be maintained to be high.

$*\text{—}SiR_1R_2R_3$ [Formula 1]

In Formula 1, $R_1$, $R_2$, and $R_3$ can each independently be a chain alkyl group having 1 to 15 carbon atoms or a branched alkyl group having 3 to 15 carbon atoms. In Formula 1, the symbol "*" refers to a position where the hydrophobic functional group is bonded to the nano particle.

For example, the nano particle 141 surface-modified with a hydrophobic functional group can be represented by the following Formula 1a.

[Formula 1a]

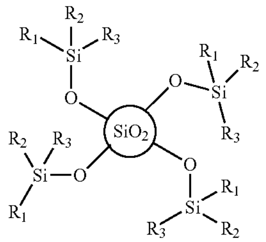

In Formula 1a, $R_1$, $R_2$, and $R_3$ can each independently be a chain alkyl group having 1 to 15 carbon atoms or a branched alkyl group having 3 to 15 carbon atoms.

For example, the nano particle 141 surface-modified with the hydrophobic functional group represented by the above Formula 1a can be prepared by reacting silica ($SiO_2$)_nano particles containing a hydroxyl group (—OH) on the surface with an alkyldisilazane compound. For example, the alkyldisilazane compound can be selected from tetraalkyldisilazane and hexaalkyldisilazane. The silica nanoparticles surface-modified using an alkyldisilazane compound contain hydrophobic trialkylsilane groups on the surface of the silica nanoparticles. Specifically, for example, the alkyldisilazane compound can be hexamethyldisilazane, but is not limited thereto. The silica nano particle surface-modified with hexamethyldisilazane can be represented by the following Formula 1b.

[Formula 1b]

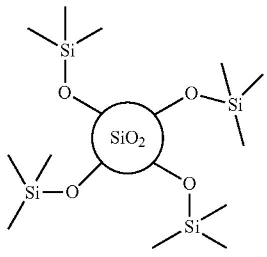

The nano particle layer 140 can be formed of a solution prepared by dissolving nano particles 141 surface-modified with a hydrophobic functional group in a solvent. For example, the solvent can use a material capable of uniformly dispersing the nanoparticles surface-modified with a hydrophobic functional group at a vapor pressure of 1 KPa to 10

KPa at 25° C. For example, the solvent can be toluene or ethanol, but is not limited thereto. For example, the nano particle layer 140 can be formed by processes of applying a solution in which the nanoparticles 141 surface-modified with a hydrophobic functional group are dispersed in an area overlapping the gate driver GIP before depositing the encapsulation layer 150, and then volatilizing the solvent. At this time, in order to quickly volatilize the solvent, the heat can be applied in a range which does not cause the damage to the display device 100. As described above, the nano particle layer 140 is formed before depositing the encapsulation layer 150 so that diffusion of hydrogen generated during the process of depositing the encapsulation layer 150 into the gate driver GIP can be minimized. Therefore, the gate driver circuit GDC formed of the oxide semiconductor is not conducted by the hydrogen so that the excellent driving characteristic is provided.

The encapsulation layer 150 is formed on the entire surface of the display area DA and the non-display area NDA. The encapsulation layer 150 is disposed to directly cover the capping layer CPL of the display area DA and the nano particle layer 140 of the non-display area NDA. The encapsulation layer 150 blocks the moisture or oxygen entering from the outside to suppress oxidation and deterioration of the organic light emitting diode 130. For example, the encapsulation layer 150 can be formed of an inorganic material, such as silicon oxide, silicon nitride, or silicon oxynitride, but is not limited thereto. For example, the encapsulation layer 150 can be formed by the chemical vapor deposition method. The chemical vapor deposition method has advantages in that the deposition time is fast, the process control is easy, and the quality of the deposited film is excellent. As described above, when the encapsulation layer 150 is formed by the chemical vapor deposition method, hydrogen is generated during the process. However, in the display device 100 according to the exemplary embodiment of the present disclosure, the nano particle layer 140 is disposed so as to overlap the gate driver GIP so that the diffusion of the hydrogen is suppressed to protect the gate driver GIP so as not to be conducted.

The encapsulation substrate 170 is disposed on the organic light emitting diode 130 so as to be opposite to the substrate 110. The encapsulation substrate 170 protects the organic light emitting diode 130 from the external shock and suppresses the permeation of foreign materials, moisture, oxygen, or the like.

The adhesive layer 160 is filled in the space between the encapsulation layer 150 and the encapsulation substrate 170 and bonds the substrate 110 and the encapsulation substrate 170. The adhesive layer 160 can include adhesive resin and a hygroscopic filler. The adhesive resin can use a transparent material so as not to degrade the light extraction efficiency while having the adhesiveness. The hygroscopic filler absorbs oxygen or moisture to delay the oxidation and deterioration of the organic light emitting diode 130.

The dam DAM is disposed between the substrate 110 and the encapsulation substrate 170 in the non-display area NDA. The dam DAM is disposed so as to enclose the adhesive layer 160. The dam DAM reinforces the adhesiveness between the substrate 110 and the encapsulation substrate 170 and blocks the moisture permeation. The dam DAM can include sealant and the hygroscopic filler. The dam DAM can be a transparent dam formed of a transparent material. In this case, the light transmittance of the non-display area NDA is excellent to be advantageous to implement a transparent bezel and a transparent display device.

According to the exemplary embodiment of the present disclosure, the moisture permeation is suppressed by the nano particle layer 140 disposed so as to overlap the openings OA of the planarization layer 125 and the moisture permeation path is increased to suppress the deterioration of the display device 100 due to the moisture. Accordingly, a display device 100 having a high reliability can be provided. Further, the nano particle layer 140 is disposed so as to overlap the gate driver GIP to suppress the diffusion of the hydrogen generated during the process of depositing the encapsulation layer 150 into the gate driver GIP and suppress the conductivization of the gate driver GIP due to the hydrogen. Accordingly, a display device 100 having an excellent driving characteristic can be provided.

Figure 4:
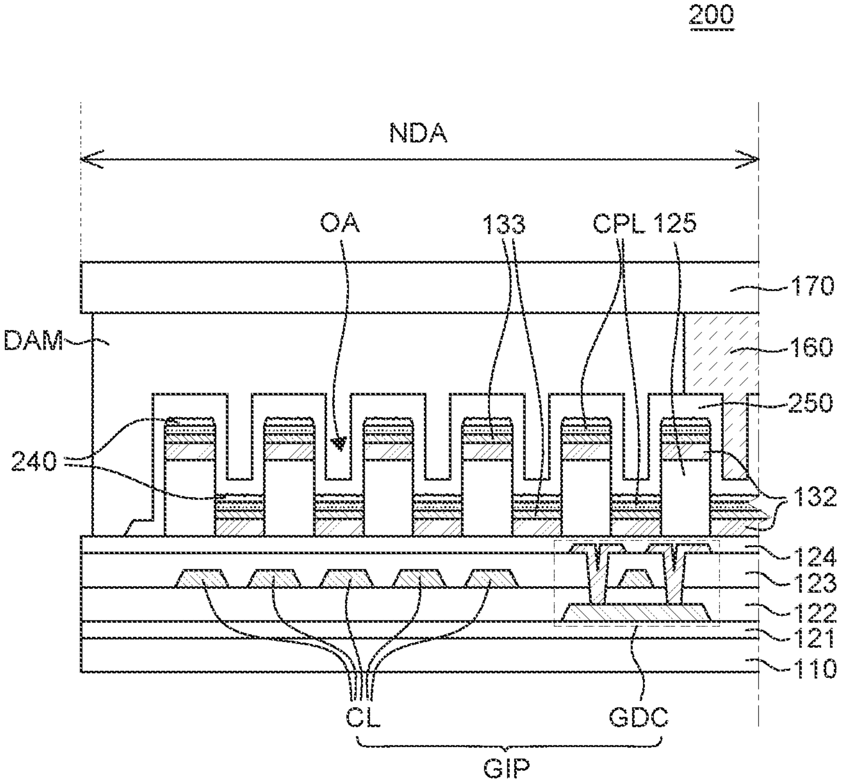
FIG. 4 is a cross-sectional view of a non-display area of a display device according to another embodiment of the present disclosure.

FIG. 4 is a cross-sectional view of a non-display area of a display device according to another embodiment of the present disclosure. A display device 200 illustrated in FIG. 4 is substantially the same as the display device 100 illustrated in FIGS. 1 to 3, except for a structure of a nano particle layer and an encapsulation layer disposed in the non-display area so that a redundant description will be omitted or will be briefly provided.

Referring to FIG. 4, in a display device 200 according to another embodiment of the present disclosure, in the non-display area NDA, the organic light emitting layer 132, the cathode 133, the capping layer CPL, and the nano particle layer 240 are sequentially laminated above the planarization layer 125 and on the protection layer 124 exposed by the plurality of openings OA.

The nano particle layer 240 is disposed so as to overlap the gate driver GIP in the non-display area NDA. Specifically, the nano particle layer 240 can be disposed so as to overlap the planarization layer 125 and the plurality of openings OA provided in the planarization layer 125. At this time, the nano particle layer 240 is not formed as one continuous layer, but is formed to be cut by the plurality of openings OP provided in the planarization layer 125 so as to correspond to the gate driver GIP. For example, the nano particle layer 240 can be disposed not to be fully filled in the plurality of openings OA, but partially filled in the plurality of openings.

As described above, the nano particle layer 240 is formed by coating a solution prepared by dissolving nanoparticles surface-modified with hydrophobic functional groups in a solvent on an area overlapping the gate driver GIP. At this time, the thickness of the nano particle layer 240 can be controlled by controlling the concentration of the nano particles surface-modified with the hydrophobic functional group in the solution. The lower the concentration of the nano particles surface-modified with the hydrophobic functional group, the smaller the thickness of the nano particle layers 240 is formed. Accordingly, if necessary, the thickness of the nano particle layer 240 filled in the plurality of openings OA can be controlled by controlling the concentration of the nano particles surface-modified with the hydrophobic functional group.

The nano particle layer 240 is disposed not to be fully filled in the plurality of openings OA, but partially filled in the plurality of openings so that the encapsulation layer 250 does not provide a flat surface in the non-display area NDA. For example, the encapsulation layer 250 is formed as a conformal thin film to have a constant thickness according to the shape of the layer therebelow. However, the present disclosure is not limited thereto, so that a flat surface can be provided depending on the process method or the design.

The embodiments of the present disclosure can also be described as follows:

According to an aspect of the present disclosure, a display device can include a substrate in which a display area and a non-display area enclosing the display area are defined; a thin film transistor disposed on the substrate corresponding to the display area; a gate driver disposed on the substrate corresponding to the non-display area; a protection layer disposed to cover the thin film transistor and the gate driver; a planarization layer which is disposed on the protection layer and includes a plurality of openings which exposes at least a part of the protection layer in the non-display area; an organic light emitting diode which is disposed on the planarization layer so as to be electrically connected to the thin film transistor in the display area; and a nano particle layer disposed on the protection layer overlapping the plurality of openings, wherein the nano particle layer includes nanoparticles surface-modified with a hydrophobic functional group.

The nano particle layer can be disposed so as to overlap the gate driver.

The nano particle layer can be disposed above the planarization layer corresponding to the non-display area and on the protection layer overlapping the plurality of openings.

The nano particle layer can be filled in the plurality of openings.

The organic light emitting diode can include: an anode which is disposed on the planarization layer so as to be electrically connected to the thin film transistor; an organic light emitting layer disposed on the anode; and a cathode disposed on the organic light emitting layer, and the organic light emitting layer and the cathode are respectively disposed on the planarization layer and on the protection layer overlapping the plurality of openings in the non-display area.

The nano particle layer can be disposed on the cathode in the non-display area.

The display device can further comprise a capping layer disposed on the cathode, wherein the nano particle layer can be disposed on the capping layer.

The nanoparticles can be one or more selected from silica (Sift) nanoparticles, titanium dioxide ($TiO_2$) nanoparticles, tin oxide ($SnO_2$) nanoparticles, zinc oxide (ZnO) nanoparticles, copper oxide (CuO) nanoparticles, zirconium oxide ($ZrO_2$) nanoparticles, tungsten oxide ($WO_2$) nanoparticles, tantalum pentoxide ($Ta_2O_5$) nanoparticles, vanadium pentoxide ($V_2O_5$) nanoparticles, and iron oxide ($Fe_2O_3$) nanoparticles.

The hydrophobic functional group can be a trialkyl silane group represented by Formula 1 below.

$$*\text{—}SiR_1R_2R_3 \qquad \text{[Formula 1]}$$

In Formula 1, $R_1$, $R_2$, and $R_3$ can be each independently a chain alkyl group having 1 to 15 carbon atoms or a branched alkyl group having 3 to 15 carbon atoms.

The display device can further comprise an encapsulation layer disposed so as to cover the organic light emitting diode and the nano particle layer.

The display device can further comprise an encapsulation substrate which is disposed on the organic light emitting diode so as to be opposite to the substrate, an adhesive layer which is filled in a space between the encapsulation substrate and the organic light emitting diode and bonds the substrate and a transparent dam which encloses the adhesive layer in the non-display area.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate in which a display area and a non-display area adjacent to the display area are disposed;

a thin film transistor disposed on a portion of the substrate that corresponds to the display area;

a gate driver disposed on a portion of the substrate that corresponds to the non-display area;

a protection layer disposed to cover the thin film transistor and the gate driver;

a planarization layer disposed on the protection layer and including a plurality of openings that expose at least a part of the protection layer in the non-display area;

an organic light emitting diode disposed on the planarization layer so as to be electrically connected to the thin film transistor in the display area; and a nano particle layer disposed on the protection layer overlapping the plurality of openings, wherein the nano particle layer includes nanoparticles surface-modified with a hydrophobic functional group, wherein the nano particle layer is disposed so as to overlap the gate driver, and wherein the nano particle layer is surrounded by an organic light emitting layer of organic light emitting diode, a cathode of organic light emitting diode, the planarization layer, and an encapsulation layer disposed on the organic light emitting diode.

2. The display device according to claim 1, wherein the nano particle layer is disposed above the planarization layer corresponding to the non-display area, and is disposed on the protection layer overlapping the plurality of openings.

3. The display device according to claim 2, wherein the nano particle layer is filled in the plurality of openings.

4. The display device according to claim 1, wherein the organic light emitting diode includes:

an anode disposed on the planarization layer so as to be electrically connected to the thin film transistor;

the organic light emitting layer disposed on the anode; and the cathode disposed on the organic light emitting layer, and the organic light emitting layer and the cathode are respectively disposed on the planarization layer and on the protection layer overlapping the plurality of openings in the non-display area.

5. The display device according to claim 4, wherein the nano particle layer is disposed on the cathode in the non-display area.

6. The display device according to claim 4, further comprising:

a capping layer disposed on the cathode, wherein the nano particle layer is disposed on the capping layer.

7. The display device according to claim 1, wherein the nanoparticles are one or more selected from silica ($SiO_2$) nanoparticles, titanium dioxide ($TiO_2$) nanoparticles, tin oxide ($SnO_2$) nanoparticles, zinc oxide (ZnO) nanoparticles, copper oxide (CuO) nanoparticles, zirconium oxide ($ZrO_2$) nanoparticles, tungsten oxide ($WO_2$) nanoparticles, tantalum pentoxide ($Ta_2O_5$) nanoparticles, vanadium pentoxide ($V_2O_5$) nanoparticles, and iron oxide ($Fe_2O_3$) nanoparticles.

8. The display device according to claim 1, wherein the hydrophobic functional group is a trialkyl silane group represented by Formula 1:

$$*\text{—}SiR_1R_2R_3 \quad \text{[Formula 1]}$$

where $R_1$, $R_2$, and $R_3$ are each independently a chain alkyl group having 1 to 15 carbon atoms or a branched alkyl group having 3 to 15 carbon atoms.

9. The display device according to claim 1, further comprising:

an encapsulation layer disposed to cover the organic light emitting diode and the nano particle layer.

10. The display device according to claim 1, further comprising:

an encapsulation substrate disposed on the organic light emitting diode so as to be opposite to the substrate;

an adhesive layer filled in a space between the encapsulation substrate and the organic light emitting diode, and bonding the substrate; and a transparent dam enclosing the adhesive layer in the non-display area.

* * * * *